United States Patent
Miyatake et al.

(10) Patent No.: US 6,426,657 B1
(45) Date of Patent: *Jul. 30, 2002

(54) SENSE-AMPLIFYING CIRCUIT

(75) Inventors: Hisatada Miyatake, Otsu; Yotaro Mori, Shiga-Ken; Masahiro Tanaka, Moriyana, all of (JP)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/417,560

(22) Filed: Oct. 14, 1999

(30) Foreign Application Priority Data

Oct. 29, 1998 (JP) .............................. 10-308131

(51) Int. Cl.⁷ ................................ G01R 15/00
(52) U.S. Cl. ......................... 327/55; 327/56
(58) Field of Search ................... 327/50, 51, 52–55, 327/57, 66, 72, 67, 64, 560, 307, 77, 56; 365/203, 207, 205

(56) References Cited

U.S. PATENT DOCUMENTS

| | | | | |
|---|---|---|---|---|
| 3,955,101 A | * | 5/1976 | Amelio | 327/68 |
| 4,169,233 A | * | 9/1979 | Haraszti | 327/55 |
| 4,181,865 A | * | 1/1980 | Kohyama | 365/205 |
| 4,763,026 A | * | 8/1988 | Tsen et al. | 365/207 |
| 4,843,264 A | * | 6/1989 | Galbraith | 327/55 |
| 5,017,805 A | * | 5/1991 | Kase | 327/307 |
| 5,512,852 A | * | 4/1996 | Kowalski | 327/77 |
| 5,563,842 A | * | 10/1996 | Challa | 365/203 |
| 5,854,562 A | * | 12/1998 | Toyoshima et al. | 327/55 |
| 5,949,256 A | * | 9/1999 | Zhang et al. | 327/55 |
| 5,963,495 A | * | 10/1999 | Kumar | 365/202 |
| 6,008,673 A | * | 12/1999 | Glass et al. | 327/55 |
| 6,181,591 B1 | * | 1/2001 | Miyatake et al. | 365/49 |

* cited by examiner

*Primary Examiner*—Terry D. Cunningham
*Assistant Examiner*—Long Nguyen
(74) *Attorney, Agent, or Firm*—Robert A. Walsh

(57) ABSTRACT

The present invention provides a single-ended signal detection circuit (sense-amplifier) which exhibits a little power consumption and performs a high speed operation. A sense-amplifying circuit (100) detects a signal on one signal line to amplify the detected signal. A sensing switch composed of first and second switches (13, 14), each of which is connected to a source terminal of the sense-amplifying circuit and to a constant current source (15), the first switch being connected to a signal line (10) and the second switch being connected to a reference potential (Vref), wherein a driving force of the first switch is larger than that of the second switch.

7 Claims, 2 Drawing Sheets

SENSE-AMPLIFYING CIRCUIT

The present invention relates to a circuit for detecting and amplifying a signal on a single signal line (single-ended signal), more specifically to a circuit (sense-amplifying circuit) for detecting and amplifying the signal having "match"/"non-match" information of a word which is essential in a content addressable memory (hereinafter referred to as a CAM), at the time the signal is still small.

BACKGROUND OF THE INVENTION

Since a single-ended signal line such as a word match line transmits a single-ended signal, ordinary, conventional differential amplifiers cannot be used for detecting and amplifying the signal as they are. Accordingly, it is necessary to modify and improve conventional differential amplifiers so as to be used for detecting and amplifying the single-ended signal.

FIGS. 1 and 2 exemplify a word match line for use in a conventional CAM composed of MOS transistors and its signal detection circuit. FIG. 1 is one of the most common examples, which is constituted so as to receive the word match line (a sub-word match line in FIG. 1) by a primitive logic gate. FIG. 2 shows a construction constituted by primitive logic gates, but utilizes charge redistributions (charge sharing) among parasitic capacitance in order to achieve a high speed operation.

Although the primitive logic gate circuit typified by the circuit of FIG. 1 is very simple and small in size, there is the following problems in this type of circuit.

The circuit of FIG. 1 is confronted with a problem that a signal on the match line is not transmitted to a subsequent stage of the circuit until the potential at the match line traverses the threshold of the logic circuit, so-called "logic threshold". In other words, there is a problem that the operation speed of the circuit is slow. The slow speed of the operation will be particularly serious when a motion of the match line is slow. To be more specific, the slow speed of the operation will be serious when only one cell among the CAM cells constituting the word drives the match line or when the CAM cells are connected in series to the match line. The speed of this portion of the CAM determines a speed of a search operation of the CAM. Although the logic threshold can partially be controlled by adjusting the sizes of transistors constituting the logic circuit, the logic threshold is limited by the threshold voltage Vt of the transistors.

Moreover, while the match line makes a slow speed transition, a through current flows through the logic circuit that is receiving the match line, with the result that electric power is consumed uselessly. Since the number of the match lines is equal to that of addresses in the CAM, the total of the through current becomes so large that the through current cannot be neglected. The match line must change its level between the level "H" and the level "L" of the CMOS levels, in other words, the match line must change its level between the power supply level and the ground level. This is because if the match line drifts between the power supply level and the ground level, the through current flows through the logic circuit that is receiving the match line. Accordingly, the match line of relatively large capacitance must be charged and discharged between the power supply and the ground potentials. In typical designs of CAMs, input data are sent to the all memory cells so as to be compared with the data that have been already stored therein, and the word match lines at all addresses where the data do not match the input data as the word are forced to be discharged, so that the electric power for charging and discharging the word match line significantly affect the power consumption of the whole CAM circuit. If the total electrostatic capacitance of the word match line is indicated by C; the potential difference between the charged state and the discharged state, V; and the frequency of a search operation, f, the power consumption of the word match line is proportional to the square of the voltage amplitude V, as expressed as $fCV^2$, thus a large voltage amplitude of the word match line is very disadvantageous for achieving a low power consumption.

BRIEF SUMMARY OF THE INVENTION

A problem of the circuit of FIG. 2 arises from the utilization of the charge redistribution (charge sharing) between the parasitic capacitances. This circuit is characterized by its operation that the detection point S is precharged to the power supply level and latched with a half-latch at the start of the search cycle, then the match line and the detection point S are connected to each other after the data are loaded on the bit line, and the level of the detection point S is lowered to the vicinity of the logic threshold at a high speed by the charge sharing. However, in order to detect the level "H" without errors, the capacitance of the detection point S must be designed approximately equal to the parasitic capacitance of the whole designed match line including diffusion capacitances. Accordingly, there is a problem that as the parasitic capacitance of the match line becomes larger as a result of an increase in a width of the word, the detection circuit must be larger in size.

There is another problem in the circuit of FIG. 2 as follows. In order to enable a search cycle to be performed at the same high speed even when the search cycle just before the search cycle of interest gave a "match" as the case when the previous cycle resulted in a "non-match", the match line must be once discharged forcibly, causing the electric power to be consumed uselessly. If the match line is not discharged, a search speed varies depending on the operation history, thus the CAM must be designed in accordance with the case where the search speed is the slowest.

The object of the present invention is to solve the foregoing problems. To be more concrete, the present invention is to provide a single-ended signal detection circuit (sense-amplifier) with a high speed and a low power consumption.

According to the present invention, there is provided with a sense-amplifier circuit (100) for detecting and amplifying a signal on a single-ended signal line to amplify the signal, which comprises a pair of inverters (11, 12), in which the output terminal of one inverter is connected to the input terminal of the other inverter; and sensing switches composed of first and second switches (13, 14), each of which is connected to a source terminal of corresponding one of the inverters constituting said pair of inverters and to one constant current source (15), said first switch being connected to said signal line (10) and said second switch being connected to a reference potential (Vref), wherein a driving power of said first switch is larger than that of said second switch.

DETAILED DESCRIPTION OF PREFERRED EMBODIMENT

Figure 1:
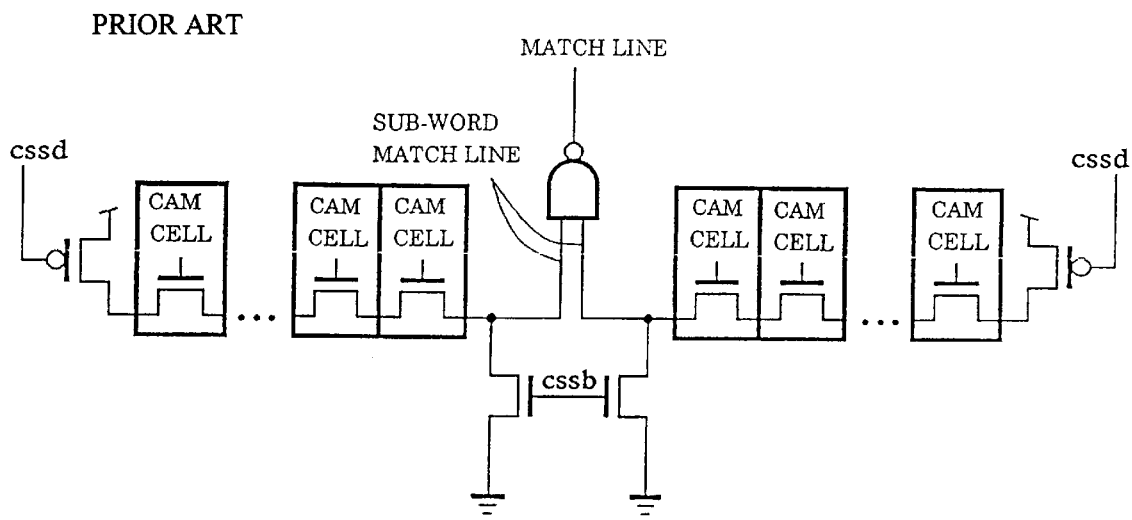
FIG. 1 illustrates a word match line used in a conventional CAM composed of MOS transistors and a signal detection circuit of the CAM.
Figure 2:
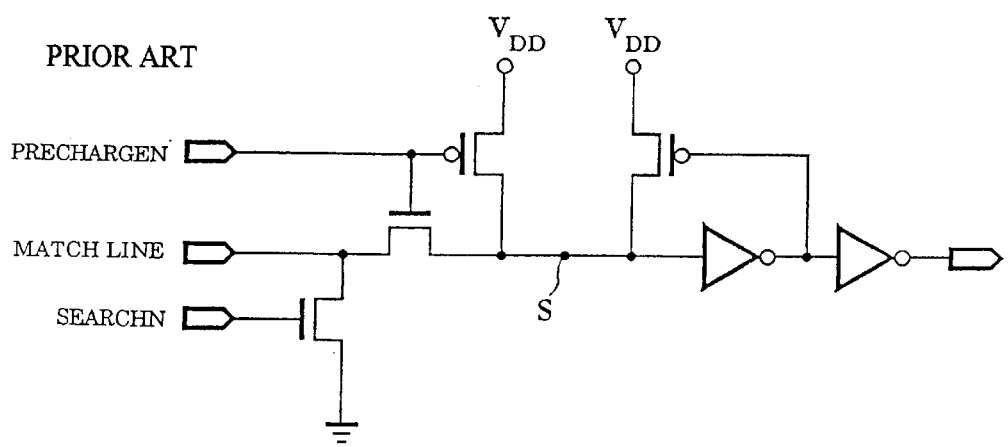
FIG. 2 illustrates a word match line signal detection circuit of a conventional CAM.
Figure 3:
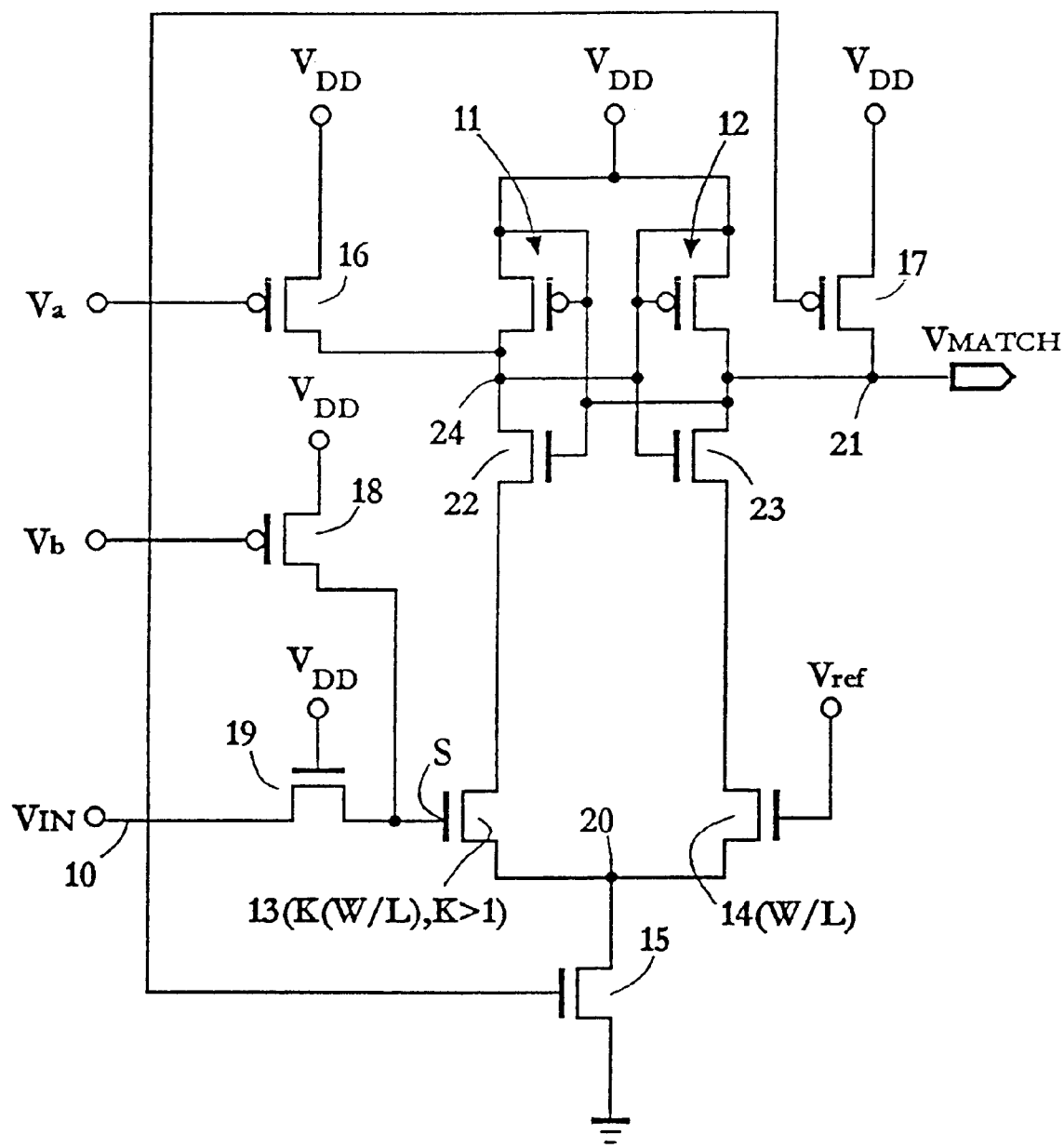
FIG. 3 illustrates an embodiment of the sense-amplifier according to the present invention.

FIG. 3 is a drawing showing a sense-amplifying circuit 100 that is an embodiment of the present invention. FIG. 3 shows an example in which a word match line of a CAM is used as a signal line to be sensed. As a matter of course, in addition to this embodiment, the present invention can be applicable to any case where a principally single small signal is sensed.

Inverters 11 and 12 composed of CMOS transistors are circularly connected, and drains of sensing transistors (NMOS) 13 and 14 are connected in series to a source terminal of each inverter. Precharge transistors (PMOS) 16 and 17 are connected to the output terminal of each inverter. In the example of FIG. 3, a differential sense-amplifier is used, which takes a circuit structure that a differential input signal is connected to gates of the sensing transistors 13 and 14, and sources of the sense transistors are connected to a constant current source (NMOS transistor) 15 as a common node to the sense transistors. In order to use the differential sense-amplifier in a single-ended style by using a simple reference potential Vref, an appropriate difference is given between inherent driving powers of the two sense transistors 13 and 14. Specifically, structural parameter $\beta$, for example, a ratio of a channel width W to a channel L, of the sense transistors 13 and 14 are set to be different from each other, whereby the driving powers of the sense transistors are made to be different from each other. To be more concrete, by setting the ratio (W/L) to be large, the inherent driving power of the sense transistor can be made to be large.

The gate terminal of the sense transistor 14 with a smaller driving power (a smaller W/L ratio) is connected to a supply source of the reference potential Vref, and a word match line 10 is connected to the gate of the sense transistor 13 with a larger driving force (a larger W/L ratio) either directly or through an interposing voltage or current limitation device. In FIG. 3, the word match line 10 is connected to the gate of the sense transistor 13 with an NMOS transistor 19 therebetween. The gate terminal of the sense transistor 13 with the larger driving power shall be called a sense point S. Here, the reference potential may be assumed to be a potential which requires no reference potential generating circuit especially. If the sense device is an NMOS transistor as shown in FIG. 3, a supply source of the reference potential may be the power supply for the whole of the circuit. As a matter of course, any kind of reference potential generating circuits may be used including a highly sophisticated or refined one.

An operation of the sense-amplifier of FIG. 3 will be described.

The word match line 10 is charged by the precharge transistor 18 during the precharge period. At this time, the sense point S is charged to the reference potential (power supply potential). It is satisfactory that the voltage limitation NMOS transistor 19 is not used. If the NMOS transistor 19 is used, the word match line 10 is charged to a potential with a level lower than the power supply potential by a threshold voltage of the NMOS transistor 19. If the NMOS transistor is not used, the word match line 10 is charged to the power potential. As the potential at the word match line 10 becomes higher, a larger backgate bias is applied to the NMOS transistor 19, with the result that the threshold voltage of the NMOS transistor 19 becomes higher by a backgate bias effect, so that the potential at the word match line 10 is set further lower by a value corresponding to the increase of the threshold voltage of the NOMS transistor 19. In any case, the sense point S is charged to the power supply potential (reference potential) and awaits the start of the sense operation with this condition.

In the precharge state, the sense-amplifier enable signal Va is fixed to a level "L", and the sense-amplifier is in a stand-by state. At this time, the common node (hereinafter referred to as a set node) 20 of the sense-amplifier is at the potential lower than the power supply potential by the threshold voltage Vt of the NMOS transistor. As a result, no current flows through the sense-amplifier.

After the precharge, when the search operation starts, data are transferred onto the bit line pairs so as to be compared with the data that have beforehand been stored in the memory cells. When a non-match is detected at least in one bit in the word, the word match line driving transistor included in the memory cell of the bit is turned on, with the result that the charge on the word match line is drawn out. The potential at the match line of the word which has a match with the input data does not vary, and the potential at the sense point S remains at the power supply potential. At an appropriate time when the potential at the sense point S of the non-matched word decreases to some extent, the enable signal Va for the sense-amplifier is driven to a level "H", thus enabling the sense-amplifier. This timing may be produced using an appropriate circuit for simulating the motion of the sense point S, which has often been carried out in a DRAM and the like.

Both of the differential inputs of the sense-amplifier for the word which has a match with the input data are equal to the power supply potential, and the sense transistor 13 which receives the sense point S possesses a driving power larger than that of the sense transistor 14 which receives the reference potential (power supply potential in this case). Accordingly, the sense-amplifier performs an operation as if the potential at the sense point were higher than that of the reference point, and the sense point is recognized to be at a level "H".

Since the match line of the word which has a non-match with the input data is in a decreased potential state, the sense transistor 14 connected to the reference potential is turned on prior to the sense transistor 13 connected to the sense point in the sense-amplifier, and the. potential at the node 21 starts to drop first. At the time the set node 20 further decreases, also the sense transistor 13 is turned on. However, since an overdrive of the gate of the sense transistor 13 is weaker than that of the sense transistor 14, and since the driving power of the NMOS transistor 22 constituting the inverter 11 is weaker than that of the NMOS transistor 23 constituting the inverter 12 because the potential at the node 21 already has been decreased somewhat, even the transistor 13 with the strong inherent driving power can never reverse the potentials of the nodes 21 and 24 as long as the potential at the sense point S drops to a level lower than a predetermined value. Then, the potential at the node 21 further decreases to the ground level, and the potential at the node 24 is fixed to the power supply potential. In other words, the sense point S is considered to be a level "L", and a signal indicating that the word has a non-match with the input data is output as the output of the sense-amplifier.

Since the level that is recognized as a level "L" in the case where the potential of the sense point S is lowered depends on the difference in the inherent driving power between the sense transistors 13 and 14, an adjustment can be easily performed by appropriately setting the foregoing W/L ratio. Moreover, the level does not depend on an inherent threshold voltage Vt of the transistor. It is satisfactory that the inherent driving power is determined taking into consideration the noise margin.

As described above, using the sense-amplifier 100 of the present invention, it is possible to transmit a signal, which indicates whether or not the word has a match with the input data, to a subsequent stage at the time a small signal appears at the sense point, thus achieving a high speed of the search operation. This effect becomes more significant with wider words because as the word width becomes larger, a parasitic capacitance of the word match line is larger and a motion of the word match line is slower.

Furthermore, an output VMATCH of the sense-amplifier after termination of the sense-amplification is either at the power supply potential or at the ground potential depending on whether the sense point S is close to the level of the power supply potential or lower. Here, since the input VIN which is an input to the sense-amplifier, has only to move by a value corresponding to the designed input sensitivity of the sense-amplifier, the charge/discharge current of the match line 10 for driving the sense-amplifier input is significantly reduced by controlling the match line in such a manner.

Moreover, after the termination of the sense-amplification, the amplification result is latched to be kept as long as the transistors 13 and 14 included in the sense-amplifier are at the turning-on state. This is one of excellent features of the sense-amplifier. Accordingly, the precharge control signal Vb can be turned to a level "L" immediately after the end of the sense operation so that the sense point S and the match line may be precharged. Thus, it is possible to prepare for a subsequent search operation while holding the search result and outputting it. Specifically, the cycle time of the search operation can be shortened. Moreover, after the termination of the amplification, that is, after the termination of the latching, a path from the power supply to the ground is cut off, so that no current may flow through the sense-amplifier.

As described above, the transistor 19 provided for limiting the voltage at the match line 10 can be omitted. When the transistor 19 is used, the precharge potential of the match line 10 is suppressed to a potential lower than the power supply potential by the threshold voltage Vt of the transistor 19, with the result that the charging/discharging power of the match line is more decreased. In addition to this, there is also an advantage that a response of the sense point S at the time the match line starts to drop is made to be faster by the charge sharing.

The constitution and operation of the sense-amplifier of the present invention were heretofore described with reference to FIG. 3. Effects obtained when the present invention is applied to a word match line of a CAM as shown in FIG. 3 will be described.

The signal amplitude of the word match line can be suppressed to a level approximately equal to the sensitivity of the sense-amplifier. Accordingly, it is possible to suppress the power consumption in the search operation. In typical designs of CAMs, the word match line is precharged prior to the search operation, and the match lines of almost all words where non-matches are obtained are discharged. Accordingly, a power consumption can be significantly reduced by decreasing the signal amplitude of the word match line. Since the power consumption is in proportion to an operation frequency, an electrostatic capacitance which must be charged/discharged, and a square of a voltage amplitude, that is, $Pd = f \cdot C \cdot V^2$, an effect obtained by decreasing the voltage amplitude is remarkable. For example, when the CAM of 2048 words 64×bits is constituted on an IC manufacturing technology with a feature size of about 0.25 $\mu$m, the load imposed on the word match line is about 0.2 pF per one line. If the non-matches of 2000 words are detected in a search operation with a frequency of 66 MHz, in the case of the prior art the electric power required for charging/discharging the word match line will be equal to 66 MHz×(0.2 pF 2000)×(3.3V)$^2$=287.5 mW. When the voltage amplitude of the match line is suppressed to 0.7V using the sense-amplifier circuit of the present invention, the electric power is 66 MHz×(0.2 pF 2000)×(0.7V)$^2$=12.9 mW. Accordingly, about 95.5% of the total power that is a large value can be saved.

Since it is possible to perform the sense-amplification of the signal on the word match line at a high speed and at an early timing in order to transmit the signal to a subsequent stage, the search operation can be performed at a high speed. In typical designs of CAMs, at the words in which a non-match is detected in only one bit, charge of the word match line with a comparatively heavy load are drawn by a small transistor included in a memory cell, it takes a long time for the signal to appear on the word match line. If it is possible to perform a sense-amplification of this signal when the signal is still small, the time required for the search operation can be remarkably shortened. The time required for the search operation can be made to be about 2 ns under the typical conditions.

In the case where the word match line is connected to the sense-amplifier with the voltage limitation device interposed therebetween, the precharge voltage level of the word match line can be decreased, whereby the voltage amplitude of the word match line can be more suppressed, thus further decreasing of the power consumption can be attained. Since the word match line faster reaches a potential at which the sense operation can be performed, also the sensing operation can start earlier. As for the further decrease in the power consumption, when the voltage amplitude of the match line is set to, for example, about 0.3V, the electric power consumed by the match lines can be reduced to 2.4 mW similarly to the foregoing calculation. This value corresponds to about 0.8% in the case where no measures are taken.

The sense-amplifier circuit of the present invention has a latching function, and this latching function of the sense-amplifier has a feature that once the amplification result is latched, the amplification result is held in regardless of precharging the input line. By utilizing this feature, while holding the search result to output it, one can precharge the match lines immediately after the amplification in order to prepare for a subsequent search operation. In other words, the cycle time of the search operation can be shortened.

For the reference potential, the power supply potential can be used as it is. In this case, since a circuit for generating the reference potential is not necessary, the circuit as a whole can be simplified and the electric power can be saved.

The current path, in the sense-amplifier of the present invention, from the power supply to the ground is cut off until the sense-amplifier is enabled, the output of the sense-amplifier is amplified to the CMOS level in a short time after the sense-amplifier is enabled, and the internal node of the sense-amplifier does not remain at an intermediate level, resulting in little power consumption of the sense-amplifier itself. This is a very excellent characteristic compared to the conventional current mirror load amplifier and the like, which consume a constant DC current within the amplifier.

Since the sense-amplifier of the present invention performs an amplification to a CMOS level with one stage, unlike the current mirror type sense-amplifier, it is not required to provide another amplifier circuit in a subsequent stage. Therefore, an advantage that a small sensing system is sufficient is offered. This means that the power consumption is small also in terms of the circuit scale. Moreover, since the output is not transmitted at intermediate levels to the subsequent stage, one can have an advantage that the power consumption is small also in terms of the through current.

Thus it is apparent that there has been provided, in accordance with the invention, an improved sense-amplifying circuit which fully meets the objects and advantages set forth above. While the invention has been described and illustrated with reference to specific embodiments thereof, it is not intended that the invention be so limited. Those skilled in the art, after consideration of the foregoing description, will recognize that many variations and modifications are possible which still fall within the broad scope of the invention. It is intended that all such variations and modifications be included within the appended claims.

What is claimed is:

1. A sense-amplifying circuit for detecting and amplifying a signal on a signal line, comprising:

a pair of inverters, in which an output terminal of one inverter is connected to an input terminal of the other inverter;

sensing switches composed of first and second switches, each of which is connected to a source terminal of corresponding one of the inverters constituting said pair of inverters and to a constant current source, said first switch being connected to said signal line and said second switch being connected to a first reference potential, wherein a driving power of said first switch is larger than that of said second switch;

precharge means connected to a second reference potential for precharging said signal line to said second reference potential during a precharge operation, wherein said precharge means remains off during a search operation; and voltage limitation means connected to said second reference potential for limiting a potential at the signal line connected to said first switch.

2. The sense-amplifying circuit according to claim 1, said sense-amplifying circuit further comprising:

precharging means for precharging the output terminal of each inverter of said pair of inverters.

3. The sense-amplifying circuit according to claim 1, wherein said first and second switches are composed of a MOS transistor, and said first switch has a ratio (W/L) of a channel width (W) to a channel length (L) larger than that of said second switch.

4. The sense-amplifying circuit according to claim 3, wherein said inverters are CMOS inverters, and said first and second switches and said constant current source are composed of a MOS transistor.

5. The sense-amplifying circuit according to claim 4, wherein said signal line is a word match line which receives word information of a content addressable memory (CAM).

6. The sense-amplifying circuit according to claim 1, wherein said first reference potential and said second reference potential are connected to a common power supply potential.

7. The sense-amplifying circuit according to claim 1, wherein said precharging means comprises a p-MOSFET.

* * * * *